United States Patent [19]

Morgan et al.

[11] Patent Number: 4,551,678
[45] Date of Patent: Nov. 5, 1985

[54] PHANTOM FOR NUCLEAR MAGNETIC RESONANCE MACHINE

[76] Inventors: Tommie J. Morgan, 10718 Cranbrook, Houston, Tex. 77042; M. Robert Willcott, 3502 Drummond, Houston, Tex. 77025

[21] Appl. No.: 444,620
[22] Filed: Nov. 26, 1982
[51] Int. Cl.[4] .......................................... G01R 33/08
[52] U.S. Cl. ................................. 324/300; 324/321; 128/653
[58] Field of Search ................ 128/653; 324/309, 310, 324/313–314, 300, 308, 317, 321

[56] References Cited

PUBLICATIONS

Banas, E. et al., "Multi-Cloistered NMR Cells", *Applied Spectroscopy*, vol. 23, No. 1, 1969.
Mansfield, P. et al., "NMR Imaging in Biomedicine", Academic Press, N.Y., Apr. 13, 1982 (publ.), pp. 36–37, 110–113, 120–121, 140–143.
Wade, G. W. et al., "Acoustic Echo Computer Tomography", *Acoustic Imaging*, vol. 8, Plenum Publ., 1980.

*Primary Examiner*—Kyle L. Howell
*Assistant Examiner*—Francis J. Jaworski
*Attorney, Agent, or Firm*—Vaden, Eickenroht, Thompson & Jamison

[57] ABSTRACT

A phantom for an NMR machine is disclosed that includes a plurality of containers each filled with a material having a known spin density, T1, or T2 characteristic that differs a preselected amount from the spin density, T1, or T2 characteristics of the material in at least a portion of the other containers.

9 Claims, 7 Drawing Figures 4,551,678

PHANTOM FOR NUCLEAR MAGNETIC RESONANCE MACHINE

This invention relates to phantoms or test bodies generally, and in particular to phantoms for use with nuclear magnetic resonance machines to test the operational characteristics of the machine.

Nuclear magnetic resonance (NMR) techniques are being developed for use in many fields for chemical analysis, one of the most important of which is as a diagnostic tool in the medical field. For example, it has been suggested that the NMR technique can be used to detect cancer in human and animal tissue and to indicate the degree of malignancy (See U.S. Pat. No. 3,789,832 which issued Feb. 5, 1974 and is entitled "Apparatus and Method for Detecting Cancer in Tissue"). Therefore, large NMR machines are being developed and used to make measurements along planes passing through portions of a human body.

An NMR machine measures three characteristics of the structure of an object or substance: spin density, spin-lattice relaxation time, T1, and spin-spin relaxation time, T2.

The person analyzing the results of an NMR scan must have a reasonable knowledge of the operating characteristics of the particular machine that he is using. For example, he must know generally the ability of the machine to distinguish small objects, in other words, the resolution of the machine, which is a measure of its ability to delineate detail or distinguish objects or substances having nearly equal values of a quanity. He should also know how accurate the machine is in measuring spin density, T1, and T2.

It is therefore an object of this invention to provide a test body or "phantom" that can be used by the operator of an NMR machine to measure the performance characteristics of the machine by using substances having known characteristics.

It is a further object of this invention to provide such a phantom that indicates the resolution of an NMR machine.

These and other objects, advantages and features of this invention will be apparent to those skilled in the art from a consideration of this specification including the attached drawings and appended claims.

Figure 1:
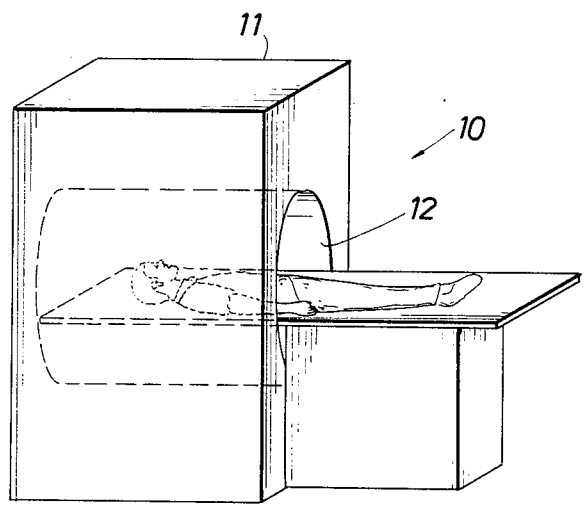
FIG. 1 is an isometric view, partly in elevation and partly in section, of a NMR machine of the type used for making whole body measurements showing a patient positioned in the magnet section of the machine.

In FIG. 1, NMR machine 10 is one designed for use in medical diagnosis by measuring the spin density, T1, and T2 of the human body along selected planes or slices through the body. Section 11 has cylindrical cavity 12 in which the patent is positioned. The magnetic field and frequency that is used to measure the NMR characteristics are provided by electronics located in section 11. Only a portion of the cavity has the right mix of magnetic field and RF frequency to provide the designed results. This is called the "sensitive volume". The part of the patent to be examined is located in the sensitive volume. The output from section 12 is an analog electrical signal. Usually, it is fed to a computer having an analog/digital converter, to a CRT, where the shape of the signal is displayed, or to a tomographic instrument for displaying an image of the section of the body along the plane that the scan was made or any combination thereof.

In accordance with this invention, a phantom is provided for testing the operational characteristics of an NMR machine that includes a plurality of containers of non-magnetic material such as glass, each of which contain a material having a known spin density, T1, or T2 characteristic that differs a preselected amount from the spin density, T1, or T2 characteristic of the material in the other containers. It may be possible to use solids in these phantoms, but at the present time T1 and T2 of any appropriate solids are of such values that it is unpractical to use solid materials at this time.

Figure 2:
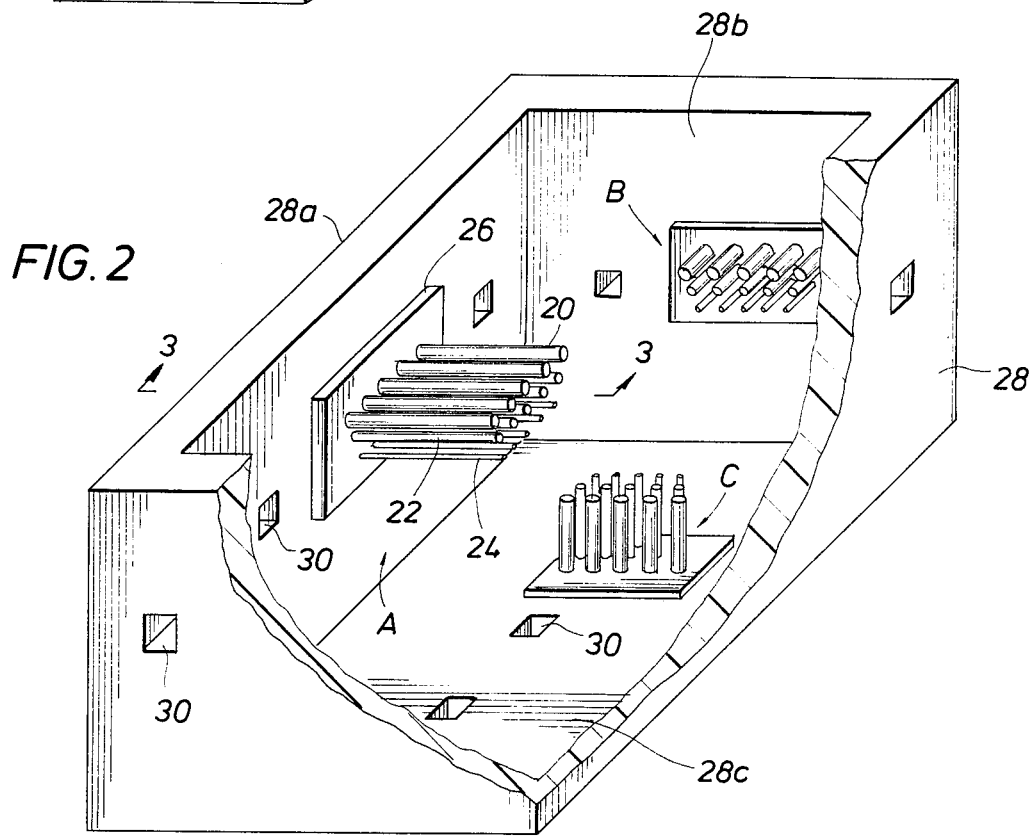
FIG. 2 is an isometric view of three phantom inserts of this invention with a portion of the base member that supports the phantom inserts broken away to show the various positions that the phantom inserts can be located on the base member to obtain scans along different planes; actually thin cross sections, through the sensitive volume areas of the NMR machine.

In FIG. 2, three phantoms are shown A, B, and C. Each phantom is identical so only one, phantom A, will be described in detail.

In this embodiment, the containers are tubular members. They must be made of a non-magnetic material. Glass and certain plastic materials are suitable and convenient to use for this purpose. In this embodiment, glass tubing serves as the containers.

In the phatom shown, a plurality of glass tubes are used. Each tube is filled with a liquid having a known spin density, T1, or T2 characteristic that differs a preselected amount from that same characteristic of the liquid in the other tubes. For example, if this phantom is designed for measuring spin density, then several tubes 20, five in this embodiment, are arranged in a row with liquids that have, for example, spin densities that are 100%, 90%, 80%, 70%, and 60% of spin density of distilled water. The liquid used will have a T1 and T2 characteristic but it is difficult enough to get the right progressive relationship of one characteristic between five liquids without having to worry about getting that same progressive relationship for T1 and T2. Therefore, each phantom will be designed to measure one characteristic only. The use of a simply parametic test object is encouraged to provide a less demanding and error susceptible evaluation of machine performance. Complex compounds are available, but the present state of the art of NMR imaging systems could be unequally penalized in the evolution process by a complex solution of T1, T2, and spin density materials. The same materials are placed in intermediate tubes 22 and the smaller diameter tubes 24, although more complex arrays could be chosen. The different diameter tubes provides a test for resolution as well as accuracy at the same time that the operator is measuring, for example, spin density. Preferably, the phantoms should include tubes of a diameter small enough that the machine is not expected to resolve them so the lower limit of performance will be confirmed and the operator will know what this limit is.

Figure 3:
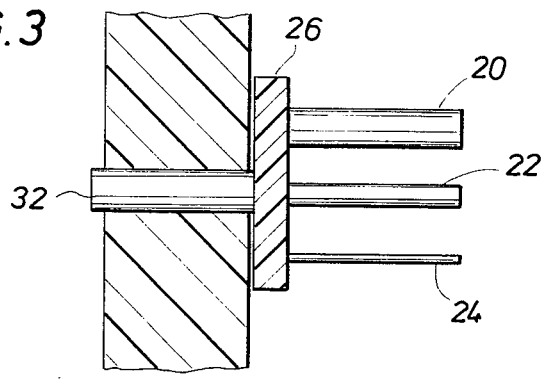
FIG. 3 is a sectional view taken along Line 3—3 of FIG. 2.

Means are provided to support the containers of the phantoms in a predetermined reproducible arrangement in the NMR machine to allow the machine to measure the known characteristics of the liquids to test the operational characteristics of the machine. The reproducible geometry for testing is essential if valid comparisons are to be made of the same or differential machines. In the embodiment shown in FIG. 2, tubes 20, 22, and 24 are mounted on mounting plate 26. The mounting plate is supported by base member 28, which is a rectangularly shaped, four-sided, box having square or round openings 30 with coded indents located in the side walls and bottom thereof. Mounting pin 32 as shown in FIG. 3, can extend into any one of square openings 30 and support the containers of the phantom inside base member 28 in the desired position. All components of the phantom support means are made of a non-magnetic material, such as glass, lucite, or lexan.

In FIG. 2, phantom A is mounted on the left hand side of the box, phantom B at the far end, and phantom C on the bottom. With this arrangement, the machine can be tested along three mutually perpendicular planes. For example a scan can be taken through phantom A perpendicular to the longitudinal axis of the tubes and parallel to the side wall 28a. The same can be done through phantom B along a plane parallel to end wall 28b of the base member and through phantom C along a plane parallel to bottom 28c. The phantoms then can be moved to various other locations in the box as desired to obtain as an extensive test pattern over the sensitive volume of the machine. The inserts can be mounted internally or externally to the base frame in the same holes in the side and end walls.

Figure 4:
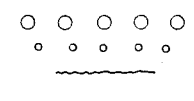
FIG. 4 is typical of the image produced by a scan through one of the phantom inserts of FIG. 2 perpendicular to the longitudinal axis of the tubular elements of the phantom.

FIG. 4 is typical of the image obtained by a scan along a plane that cuts through all of the tubes. The bottom line is just noise indicating that the lower set of tubes 24 could not be resolved.

Figure 5:
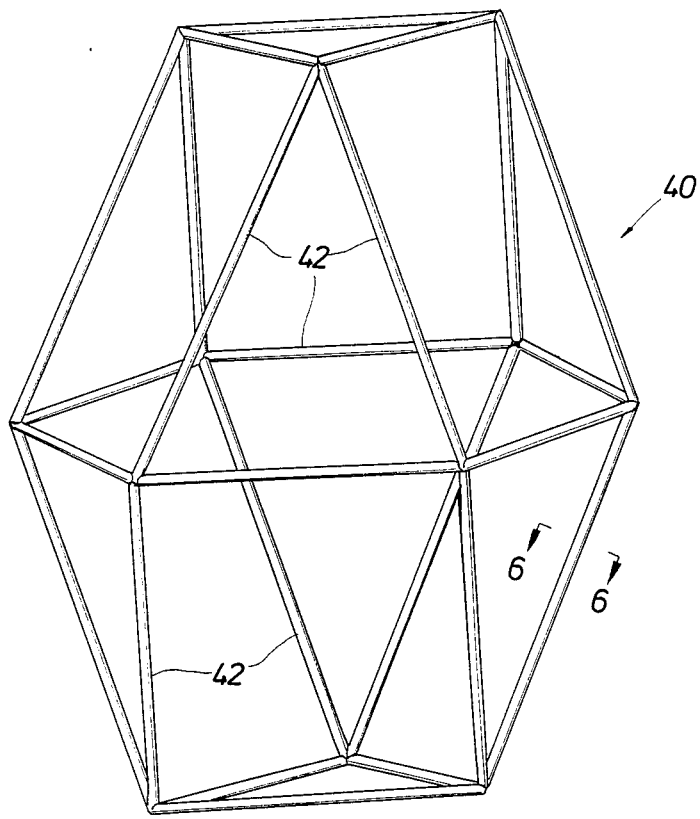
FIG. 5 is another embodiment of the phantom of this invention.

An alternate embodiment of the phantom of this invention is shown in FIG. 5. The purpose of this phantom indicated generally by the number 40, is to provide the same tests as would be obtained with the phantom shown in FIG. 2, but to also provide some additional information. Here, the lattice or framework of a polyhedron is formed by a plurality of concentric glass tubes with each tube forming one leg of the polyhedron. Each tube is filled with a material having a known characteristic that differs a preselected amount from that same characteristic of the liquid in the other tubes. For example, as shown in FIG. 5, each leg 42 of phantom 40 consists of four concentric glass tubes 44, 46, 48, and 50. Assume this phantom is for measuring T1. The liquid in central tube 44 can have a T1 of 300 milliseconds. The liquid in the annular space between tube 44 and 46, 400 milliseconds, the next 600 milliseconds, with the liquid in the outer annulus having a T1 of 800 milliseconds. The arrangement could be reversed, of course, with the T1 of the liquids increasing inwardly.

Preferably, the diameters of the tubes vary in some preselected rates. For example, the diameter of each tube could increase by a factor of three. $D_2$ would equal $3D_1$, $D_3$ would equal $3D_2$, etc.

Also, the tubes themselves could be used to provide a test of resolution. For example, two concentric tubes having outside diameters equal to $D_2$ and $D_4$ and inside diameters equal to $D_1$ and $D_2$ would be used where the material of the tubes have a preselected characteristic that could be the same or different.

Figure 6:
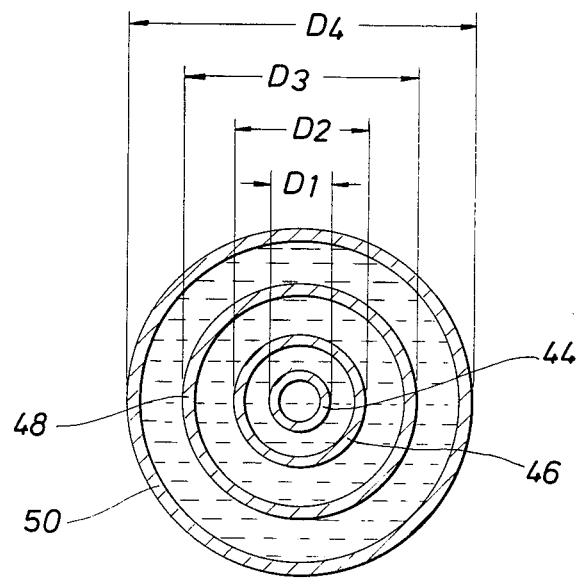
FIG. 6 is a cross sectional view taken along line 6—6 of FIG. 5.
Figure 7:
FIG. 7 is a typical output signal produced by a scan through the leg FIG. 6.

FIG. 7 shows a typical output signal for a scan through the leg of FIG. 6, where inside tube 44 cannot be resolved.

In use, the polyhedron is positioned in the sensitive volume of a NMR machine. It is self-supporting on any one of its faces. Slices through the polyhedron can be taken along any desired plane. The angle that the slice is taken can be confirmed from the resulting pattern of the cross-sections of the legs. The ability of the NMR machine to measure the selected characteristic plus its resolution ability can also be determined. The angle that the cut is taken can be determined because unless the plane is horizontal and exactly midway between the top and bottom of the polyhedron, it will cut several of the concentric glass tubing legs at an angle. Knowing the angle of the legs relative to each other and to the horizontal, the computer can determine the angle of the cut by the distance between the outer edges of the outer glass tube along the major axis of the eliptical shape of the cut.

The phantoms described herein can be used to measure the following performance characteristics of an NMR machine: precision, accuracy, spatial, contrast, noise, slice thickness, linearity, reproducibility, repositioning and positioning accuracy in the sensitive volume, indicated plane versus actual plane, evaluate accuracy of image processing, as summing, weighting, and subtracting, and pulse sequence precision and accuracy for NMR parameter determination.

From the foregoing, it will be seen that this invention is one well adapted to attain all of the ends and objects hereinabove set forth, together with other advantages that are obvious and that are inherent to the apparatus.

It will be understood that certain features and subcombinations are of utility and may be employed without reference to other features and subcombinations. This is contemplated by and is within the scope of the claims.

Since the phantom of this invention may take shape other than those described, without departing from the scope of this invention, it is to be understood that all matter herein set forth or shown in the accompanying drawings is to be interpreted as illustrative and not in a limiting sense.

The invention claimed is:

1. A phantom for use with an NMR machine comprising a plurality of concentric tubes of non-magnetic material, such as glass, each of which contain a material having a known spin density, T1, or T2 characteristic that differs a preselected amount from the spin density, T1, or T2 characteristics of the material in at least a portion of the other tubes, said tubes being connected in the form of a polyhedron.

2. A phantom for an NMR machine comprising a plurality of tubes of non-magnetic mterial, such as glass, each of which contain a material having a known spin density, T1 or T2 characteristic that differs a preselected amount from the spin density, T1, or T2 characteristics of the material in the other tubes, said tubes having several different diameters ranging from a tube diameter that the machine cannot resolve up to a tube diameter that the machine can resolve and means for supporting the tubes in a predetermined arrangement in a NMR machine to measure the performance characteristics of the machine.

3. The phantom of claim 2 in which the different diameter tubes are arranged in concentric groups.

4. The phantom of claim 3 in which the concentric groups of tubes are arranged to form the framework of a polyhedron.

5. The phantom of claim 2 in which the supporting means includes a base member of non-magnetic material having a plurality of holes therein, a mounting plate for supporting the containers, and a mounting pin attached to the mounting plate for insertion in a selected hole in the base member to locate the containers in one of several available positions in the machine.

6. The phantom of claim 5 in which the base member is a four sided box having holes in preselected positions in its sides and bottom to support containers in the box through which the characteristic of the liquid can be measured along mutually perpendicular planes.

7. A phatom for use with an NMR machine comprising a plurality of elongated containers connected together in the shape of a polyhedron with each container forming at least a part of each leg of the polyhedron and a material in each container having a known spin density, T1, or T2 characteristic.

8. The phantom of claim 7 in which at least some of the legs of the polyhedron include a plurality of said containers each containing material having a known spin density, T1, or T2 characteristic.

9. The phantom of claim 8 in which the plurality of containers are concentric tubes.

* * * * *